(12) United States Patent
Guinea et al.

(10) Patent No.: US 6,492,919 B2
(45) Date of Patent: Dec. 10, 2002

(54) CIRCUIT SYSTEM SUITABLE FOR CODIFYING NRZ TYPE BINARY SIGNALS INTO CMI TYPE BINARY SIGNALS

(75) Inventors: Jesus Guinea, Brembate (IT); Carlo Milanese, Olevano di Lomellina (IT)

(73) Assignee: STMicroelectronics S.R.L., Milan (IT)

( * ) Notice: Subject to any disclaimer, the term of this patent is extended or adjusted under 35 U.S.C. 154(b) by 0 days.

(21) Appl. No.: 09/764,584

(22) Filed: Jan. 17, 2001

(65) Prior Publication Data

US 2001/0030616 A1 Oct. 18, 2001

(30) Foreign Application Priority Data

Jan. 20, 2000 (IT) .......................... MI00A0064

(51) Int. Cl.[7] .............................. H03M 5/14
(52) U.S. Cl. .......................... 341/73; 341/68
(58) Field of Search ..................... 341/68, 73

(56) References Cited

U.S. PATENT DOCUMENTS 5,113,187 A * 5/1992 Gorshe ..................... 341/73

FOREIGN PATENT DOCUMENTS

JP       63-263846     * 10/1998 ............ H03M/5/04

OTHER PUBLICATIONS

Gorshe, *A Simple CMI Encoder and a Generalized Approach to Designing Similar State Machines*, IEEE ICC '95 Communications–Gateway to Globalization, Jun. 1995, vol. 4, pp. 1330–1334.*

*Physical/Electrical Characteristics of Hierarchical Digital Interfaces*, CCITT Recommendation G.703 of the International Telecommunication Union, Geneva, Switzerland 1991.

* cited by examiner

*Primary Examiner*—Howard L. Williams
(74) *Attorney, Agent, or Firm*—Hogan & Hartson LLP

(57) ABSTRACT

A circuit system suitable for codifying NRZ type binary signals into CMI type binary signals includes a plurality of bistable means, an EXOR type logical gate, a presynchronization device and a combinatory logic device capable of creating a CMI type binary signal by codifying with an identical circuit path the "1" bits and "0" bits, sequence of bit present in the NRZ type binary signals.

12 Claims, 5 Drawing Sheets

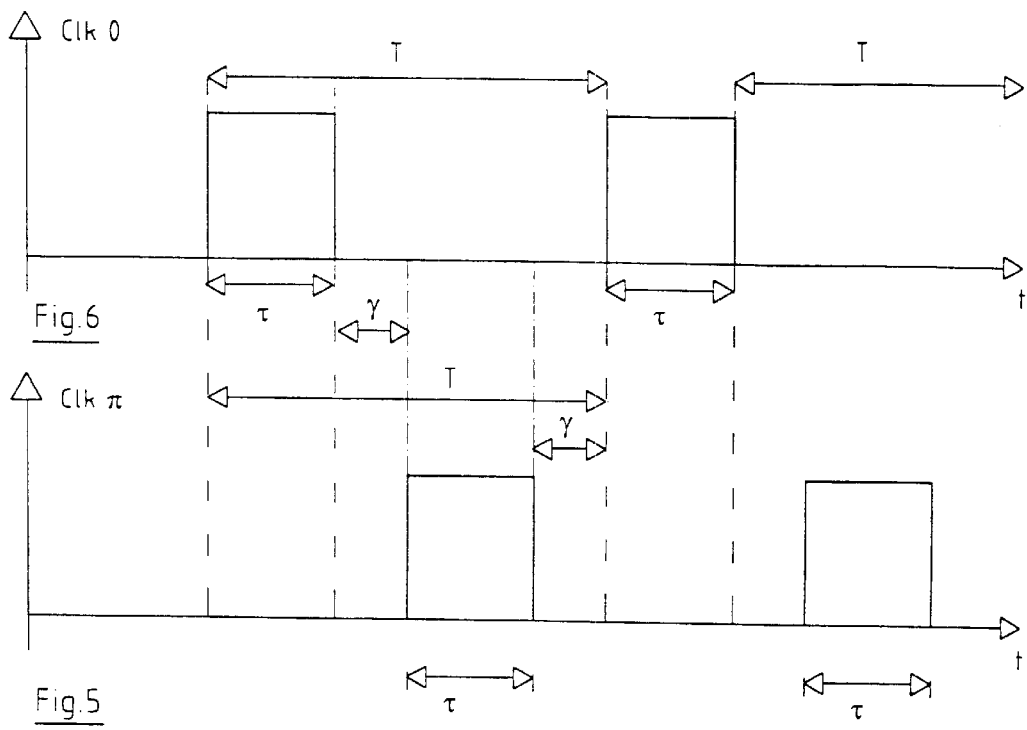
Fig.6
Fig.5
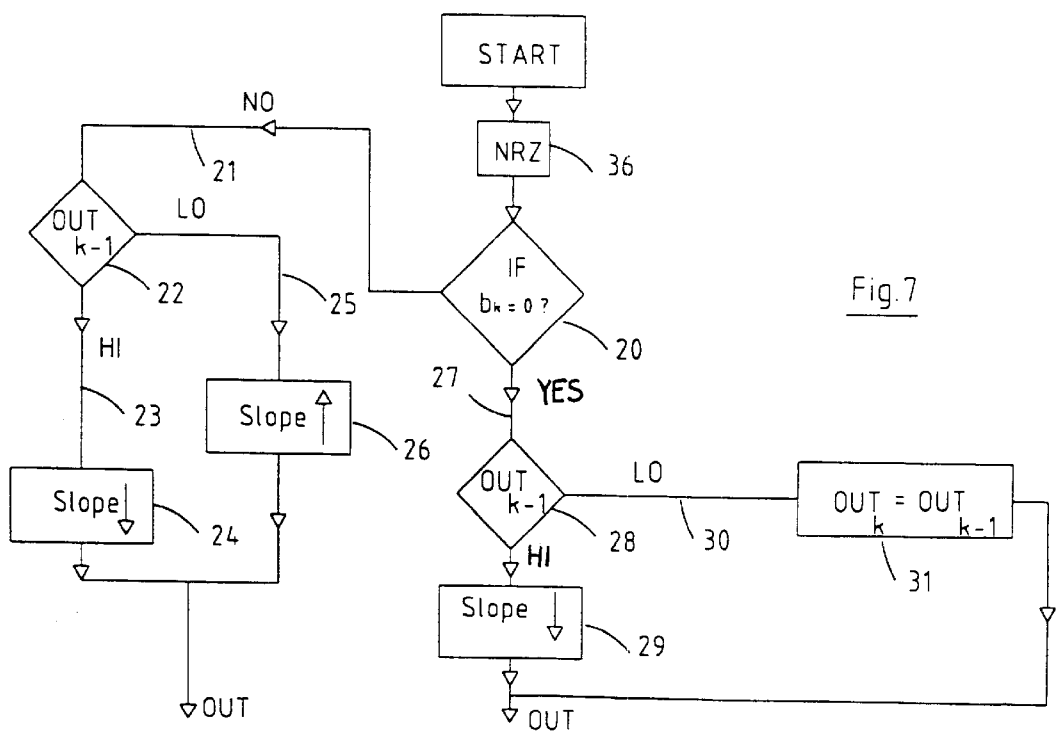
Fig.7

CIRCUIT SYSTEM SUITABLE FOR CODIFYING NRZ TYPE BINARY SIGNALS INTO CMI TYPE BINARY SIGNALS

FIELD OF THE INVENTION

The present invention refers to a circuit system to codify NRZ type binary signals into CMI type binary signals.

BACKGROUND OF THE INVENTION

In the transmission of data having electric cables as physical support, binary codification systems are used which permit the transmission of electric signals such as the clock signal, also called synchronism signals, and the data signal.

Binary codes consist of zeros and ones and in the base band transmission one of the possible codes is the so-called NRZ (Nonreturn to zero), that is a code in which there is no return to a fixed value like zero in the interval of a bit. This means that a signal in base band has a constant level in the interval of a bit and the levels to represent a bit are two so that each level corresponds to one logic state of the data, that is "1" bit (called Mark) corresponds to a high value and "0" bit (called Space) corresponds to a low value.

The NRZ code has two big disadvantages when it is transmitted on a line: 1) the presence of a long string of "0" prevents the clock signal from being extracted; 2) the presence of transformers at the extremities of the line, called repeaters, and the eventual intermediate amplifiers do not let the continuous component pass and therefore a succession of "1" bits is transformed into a succession of "0" bits.

To overcome the first disadvantage a solution has been adopted, which is called ADI (Alternate Digit Inversion), in which only the even bits are systematically inverted.

To overcome the second disadvantage the binary code ADI is converted into a code called AMI (Alternate Mark Inversion) in which the "0" bit is represented by a low level for the entire duration of the bit and the "1" bit is represented by a positive value or by a negative value alternately.

Nevertheless this last type of code also has the disadvantage that the presence of a long string of "0" prevents the clock signal from being extracted.

To eliminate these disadvantages the CMI code (Coded Mark Inversion) has been introduced, in which the "0" bit is codified so that for half the period there is a negative value and for the rest of the period there is a positive value, while the "1" bit is codified at a positive or negative value for the entire duration of the bit having inverse polarity to that used for the transmission of the last "1" bit.

To use the CMI code performance is requested for the transmission, with the STM-1e standard and 140 Mbps (Mega bounds per second), inside SDH (Synchronous Digital Hierarchy) type transmissions, set by ITU (International Telecom Unit) through G703, extremely strict for the waveforms of the voltage signal in time (*Ref.: Physical/Electrical characteristics of Hierarchical Digital Interfaces G*703 *Recommendation*, ed. November 1994, *International Telecom Unit ITU-T*).

The known circuit solutions provide that the input data are generated by an NRZ type source at a determined speed and with a determined clock signal and that said data are transformed in a CMI type code, that is a direct dependency of the final code with the input string of bits.

It results thus, that said circuit solutions can not fail the compliance with the performances but are not capable of making well defined transitions respecting the time masks set by ITU through G703 because the physical path taken by a "1" bit and by a "0" bit is different and this entails a different circuit reply with the introduction of various delays, phase displacements and distinct attenuation for the bits.

In view of the state of the art described, object of the present invention is to prevent the circuit paths followed by the bits through the various decoding phases from being different for the "1" bit and for the "0" bit, that is that the definition of the transition depends on the codified bit string.

SUMMARY OF THE INVENTION

According to the present invention, this object is reached through a circuit system suitable for codifying NRZ type binary signals into CMI type binary signals, characterized by a presynchronization device which receives in input said NRZ type binary signals and a clock signal out of phase, a first bistable means that receives a synchronous clock signal and the output of said presynchronization device, a combinatory logical device that receives said NRZ type binary signals and the output of said first bistable means, a second bistable means that receives said synchronous clock signal and the output of said combinatory logical device, a third bistable means that receives said synchronous clock signal and the output of said presynchronization device, an EXOR type logical gate that receives the outputs of said second and third bistable means and generates an output that is the input of said combinatory logical device so as to determine an identical physical path for the codification of the "1" bit and the "0" bit, whether the transition is on the leading and/or trailing edges or at mid period, bits present in said NRZ type binary signals, so that the parameters set by the G703 ITU standard for the creation of said CMI type binary signals are observed.

Thanks to the present invention a code can be made both for the "1" bit and for the "0" bit through an identical circuit that makes the same path so that the CMI code is implemented, so as to observe the specifications set by ITU through G703, thus avoiding all the disymmetries produced by the known art.

BRIEF DESCRIPTION OF THE DRAWINGS

The characteristics and advantages of the present invention will be evident from the following detailed description of an embodiment thereof, illustrated as non-limiting example in the enclosed drawings, in which:

FIGS. 5 and 6 illustrate graphics of the clock signal;

FIGS. 7 and 8 show flow diagrams of the circuit operation according to the present invention;

DETAILED DESCRIPTION OF PREFERRED EMBODIMENTS

Figure 1:
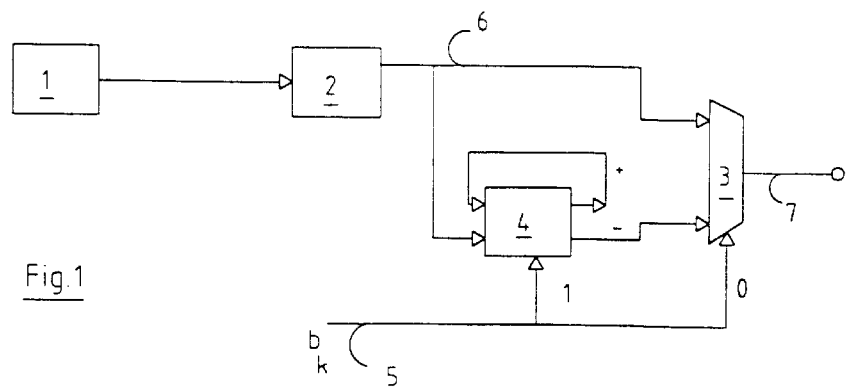
FIG. 1 shows a simplified circuit diagram according to the known art.

A simplified circuit diagram according to the known technique is shown in FIG. 1. According to what is illustrated in said Figure it can be noted that a PLL (Phase Looked Loop) type device 1 is placed in series with a frequency multiplier device 2. The combination of these two devices makes a clock signal 6, or synchronism signal. The line 5 transports a binary sequence of bits, called $b_k$, and in the event a "1" bit is present it is transmitted to a flip-flop type device 4, suitable for storing the sign of said bit. If in the sequence a "0" bit is present, it is transmitted to a multiplexer type device 3 suitable for selecting, on the basis of the clock signal 6, which bit should be put on the output line 7.

A circuit solution like this may not fail to achieve the performances but it is not able to make well defined transitions respecting the time masks set by ITU through G703 because the physical path followed by the $b_k$ bit sequence, in the case in which a "1" bit or a "0" bit is present, is different and this entails a different circuit reply with the introduction of delays, phase displacements and distinct attenuation for the bits.

We have therefore a circuit configuration suitable for codifying an NRZ type source code into a CMI type code strictly connected to the sequence of $b_k$ bits present on the line 5 of FIG. 1.

Figure 2:
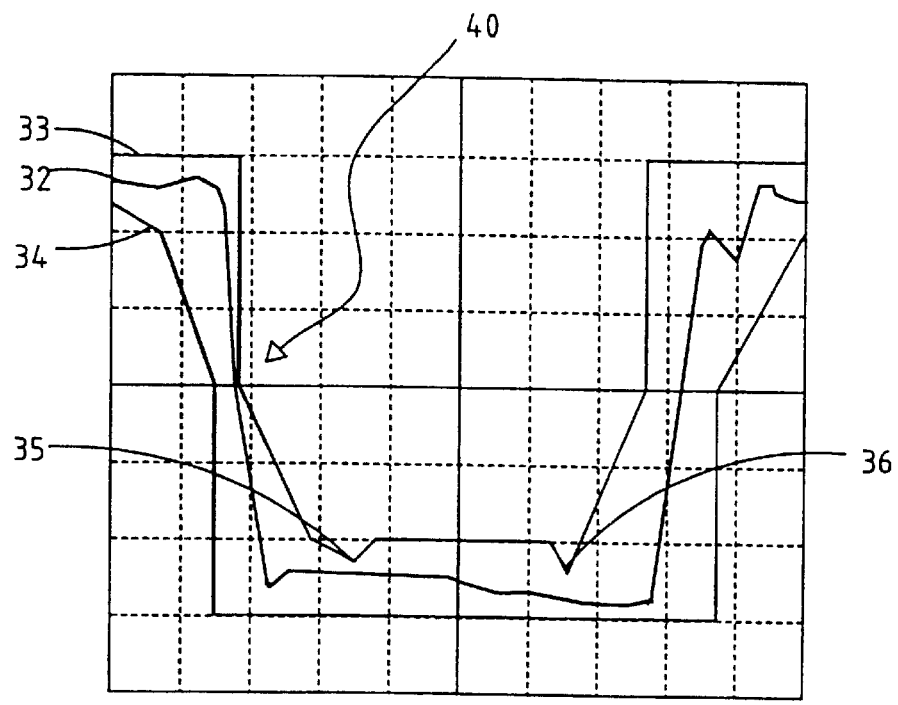
FIGS. 2 and 3 illustrate time masks and electric signals according to the present invention.

FIG. 2 represents a codified mask according to the G703 ITU standard for a "1" bit according to the present invention.

According to what is illustrated in said Figure it can be noted that a line 32 is contained between two lines 33 and 34. Line 32 is the electric signal representing the "1" bit while the lines 33 and 34 represent the G703 ITU coding mask.

In addition it can be noted that the line 33, during its central part, presents two peaks 35 and 36 for the duration of a few nanoseconds, that must not be exceeded by the electric signal 32, otherwise resulting in the not exact CMI type code of the "1" bit, and in addition that the lines 33 and 34 that define the mask have only one "critical" descent 40 for the coding of the "1" bit.

As can be inferred from FIG. 2, the coding circuit system according to the invention complies with these parameters, because the line 32 is always inside the mask pre-set for codifying the "1" bit exactly.

Figure 3:
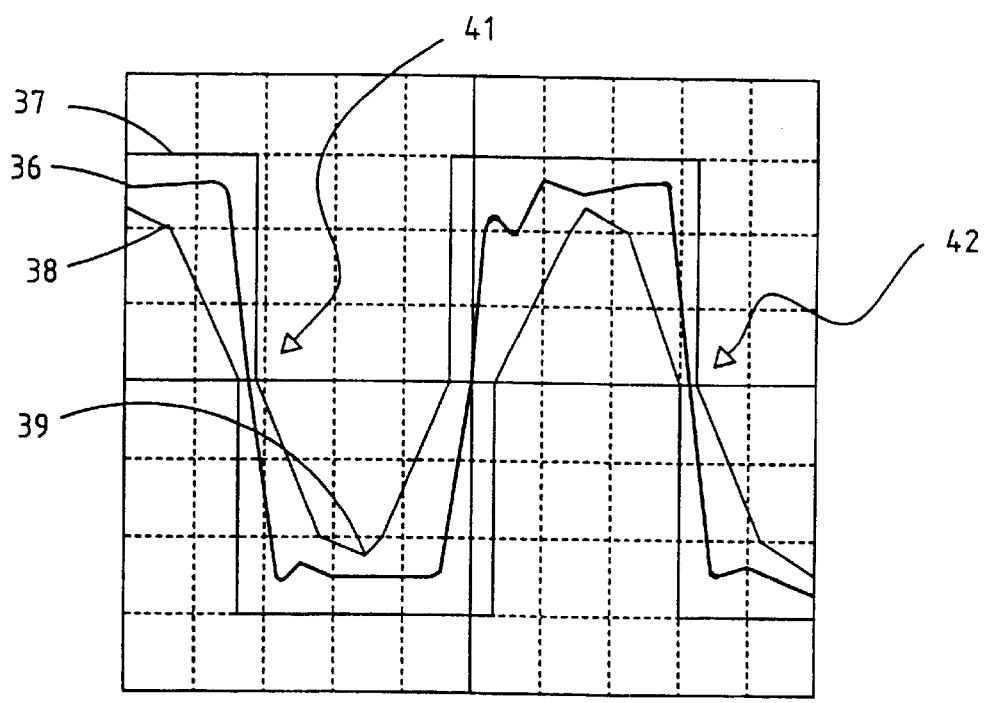

FIG. 3 represents a codified mask according to the G703 ITU standard for a "0" bit according to the present invention.

According to what is illustrated in said Figure it can be noted that a line 36 is contained between two lines 37 and 38. Line 36 represents the electric signal representing the "0" bit while the lines 37 and 38 represent the G703 ITU coding mask.

It can also be noted that the line 37 during its first central section, having a duration equal to half the coding period of the "1" bit, has a peak 39 that must not be exceeded by the electric signal 36, otherwise resulting in the not exact CMI type code of the "0" bit and in addition the lines 37 and 38, that define the mask, have two lines of "critical" descent 41 and 42 for coding the "0" bit.

As can be inferred from FIG. 3, the coding circuit system according to the invention complies with these parameters, because the line 36 is always inside the mask pre-set for the "0" bit.

To eliminate the problem inherent in the known circuit configurations like that shown in FIG. 1, a circuit solution capable of coding an NRZ type source code into a CMI type code must be created, which has an identical physical path for the coding of a bit sequence when this has a "0" bit or a "1" bit.

Figure 4:
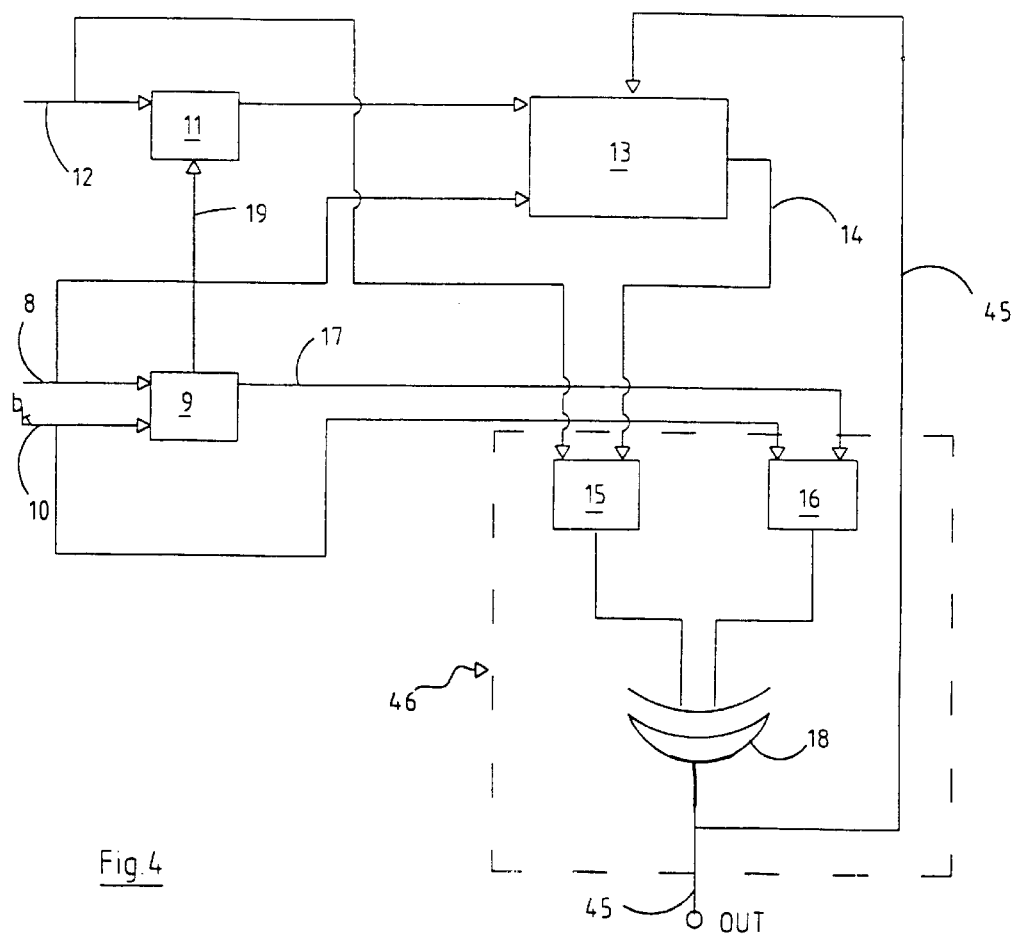
FIG. 4 shows a circuit according to the present invention.

A schematic circuit according to the present invention is shown in FIG. 4.

According to what is illustrated in said Figure it can be noted that a presynchronization device 9, which carries out an auxiliary function of the clock, has in input line 8, which transports a negated NRZ type bit binary sequence, called $b_k$, and a line 10 which transports a clock signal out of phase Clk π by 180° with respect to the original clock signal Clk 0, as shown in FIG. 5, from which it can be inferred, in this specific representation, that the time window τ is a fraction of the period T. When on the line 8 a "1" bit is present, it is transferred to a flip-flop type device 11, called "info" flip-flop, suitable for storing which is the sign of the last "1" bit sent by means of the line 19. Said block 11 receives, in addition, an input line 12 which transports a clock signal not out of phase, synchronous with the flow of data, as shown in FIG. 6, from which it is inferred in this specific representation that the time window τ is a fraction of the so-called period T just as for the clock signal out of phase by 180°, represented in FIG. 5. The function of the block 11 is, thus, to memorize the value of the sign of the last "1" bit memorized, so that the coding of the CMI type code comes about in function of the sign of the last "1" bit arrived. Said value, then, is placed in input to a device 13 suitable for making a combinatory process between the same stored value and the signal present on the line 8.

The result of this combinatory process is placed on a line 14 which is the input of a first flip-flop toggler type device 15, called "boundary" flip-flop, to which also the clock signal not out of phase present on the line 12 arrives. Said flip-flop 15 controls and memorizes which direction the transition has, that is if it has a high value or if it has a low value, at the limits of the bit evaluated. In practice said "boundary" flip-flop memorizes which type of transition comes about on the leading edge and the trailing edge of the bit under examination.

The clock signal out of phase by 180° present on the line 10 is placed in input to a second flip-flop toggler type device 16, called "middle" flip-flop, which receives in input, through the line 17, the result of the device 9, that is the sequence of bits synchronized.

The output lines of the devices 15 and 16 are the inputs of an EXOR type logical gate 18 whose output line OUT 45 is carried as an input line of the combinatory device 13, that is there is only one physical path for the coding of the "0" and "1" bits.

The combination of the flip-flop togglers 15 and 16 with the EXOR logical gate 18 creates an integrator block 46.

The flip-flop 15 device with the EXOR logical gate 18 determines the process that each single bit present in said string of bits $b_k$, once elaborated by the block 13 as previously described, undergoes during the transitions from the low value to the high value and/or vice versa.

In FIG. 7 a flow diagram is described representing the functioning logic of the flip-flop toggler device 15 in combination with the EXOR logical gate 18, from which it can be inferred that it is tested whether the value of the bit, block 20, on the string of bits coded according to the NRZ $b_k$ diagram, block 36, is a "0" bit.

If the test gives a negative result, branch 21, test is made to find out which is the value of the output to the bit (n-1)-nth/, block 22. If the test gives a high value, branch 23, the output of the bit n-nth is placed low, block 24, while if the test gives a low value, branch 25, the output is placed high, block 26.

If the test of the block 20 gives a positive result, branch 27, the value of the output at the (n-1)-nth bit, block 28, is verified. If the test gives a high value, the output of the n-nth bit is placed low, block 29, while if the test gives a low value, branch 30, the output of the n-nth bit remains the same as the value of the output of the (n-1)-nth bit, block 31.

The flip-flop device 16 with the EXOR logical gate 18 determines the process that each single bit present in said string of bits $b_k$, once elaborated by the block 13 as previously described, undergoes half-way through the period of duration T of the bit under examination.

Figure 8:
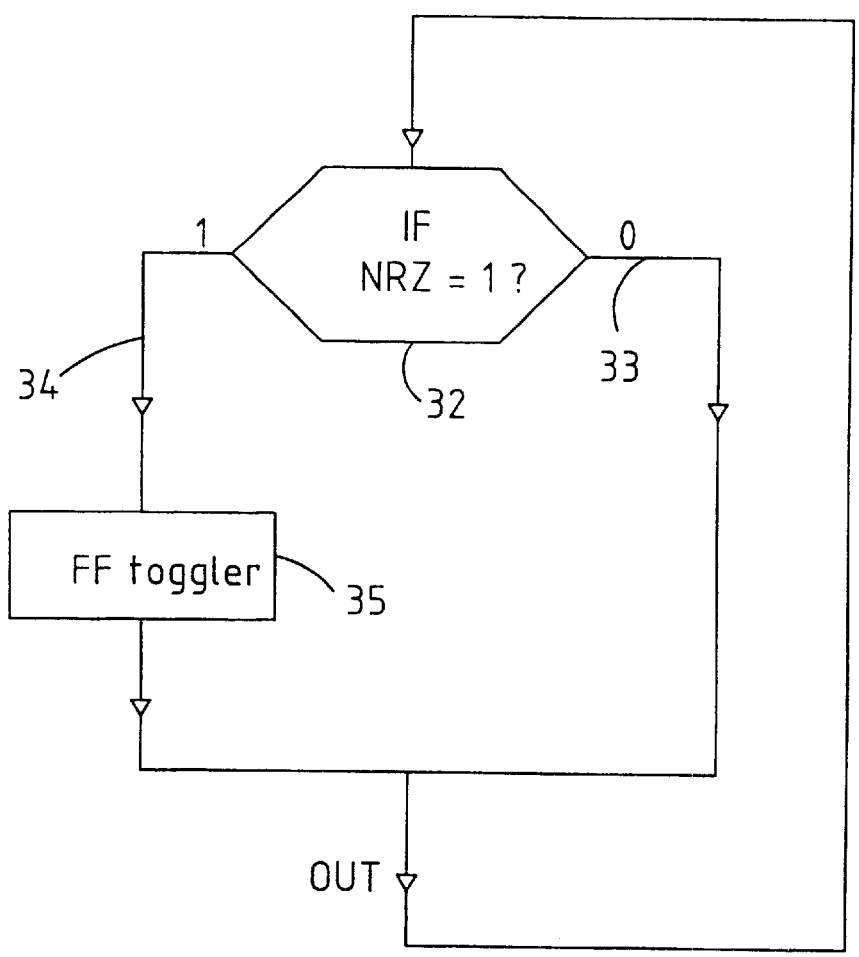

In FIG. 8 a flow diagram is described of the functioning logic of the flip-flop 16 in combination with the EXOR logical gate 18, from which it can be inferred that a test is carried out, block 32, on the string of bits coded according to the NRZ diagram. If a "0" bit is present in said string, branch 33, the bit in object does not undergo any type of operation and the output refers to the diagram of FIG. 7, that is the output is the Null type, while if in said string a "1" bit is present, branch 34, said bit is stored in a flip-flop toggler, block 35, so as to have memory of the direction of the transition just carried out, that is the output must be the same as that complemented.

The verification of the string of bits proceeds until the period T of said bit under examination is terminated.

The circuit assembly previously described therefore eliminates the problem of the different paths for the coding of the "1" and "0" bits, it eliminates, that is, the direct dependence of the string of bits in input since the path followed by the bits for coding is identical and therefore an extrapolation is obtained which does not refer to the CMI type binary code in itself but refers to a differential form of how the transitions of a "1" bit or of a "0" bit are coded regardless of the string of bits in input.

The block 46 in carrying out a function of integrator therefore carries out the final CMI type codifying, placed on the line of output 45, of the string of $b_k$ bits present on the line of input 8.

Figure 9:
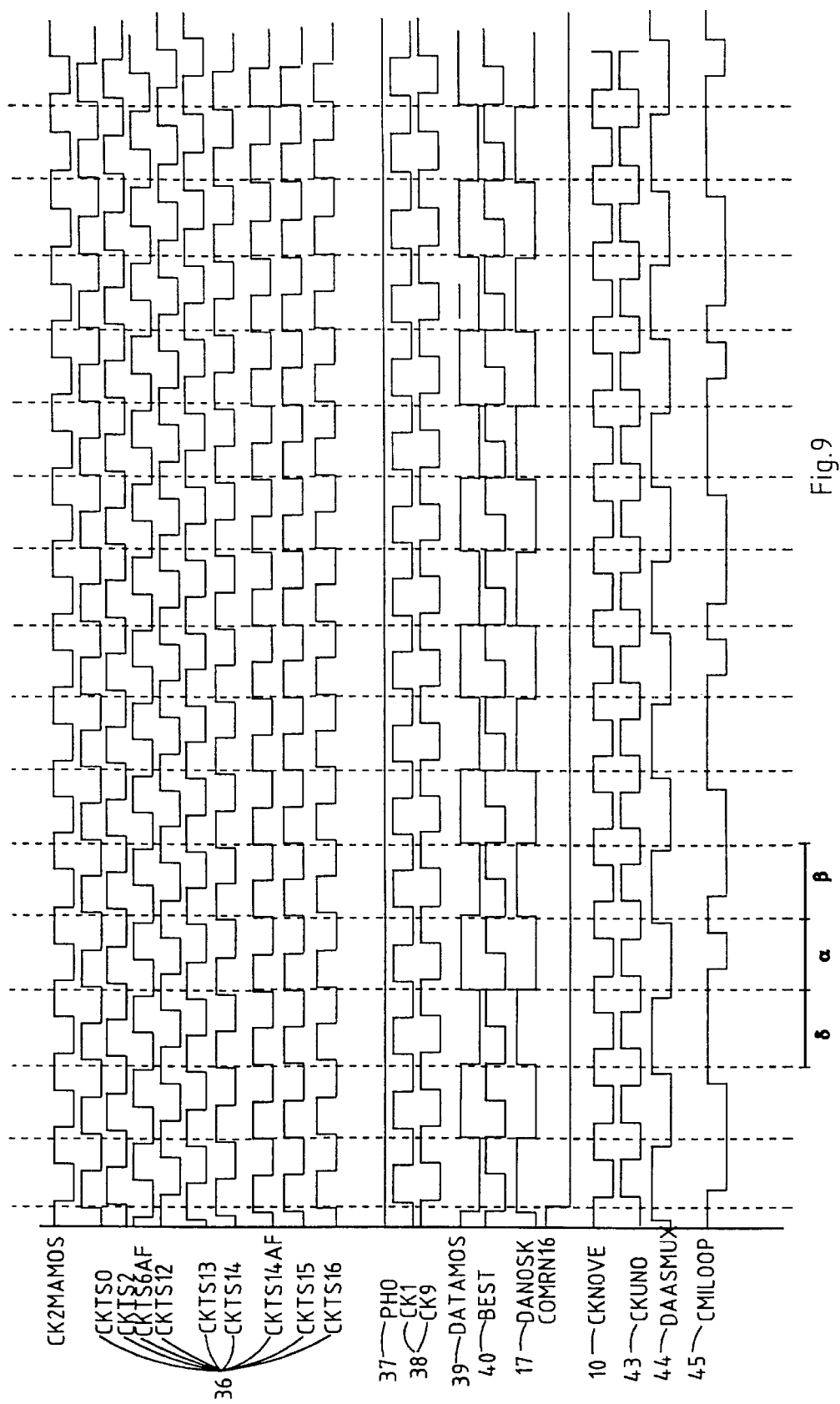
FIG. 9 illustrates a numeric simulation of the circuit according to the present invention.

A numeric simulation of the circuit according to the present invention is illustrated in FIG. 9.

According to what is illustrated in said Figure a plurality of electric signals can be noted, amongst which there is: a first group 36 which represents timing signals all out of phase in relation to each other which are generated by a block combination of the block 1 and 2 of FIG. 1, also called delay looked loop block (DLL), in function of a master or reference timing signal (not present in the drawings) so that the circuit system for codifying NRZ binary signals in CMI binary signals is synchronous with said master clock signal; an electric signal 37 that represents the feedback control signal of said DLL block; a second group of electric signals 38 that represent "buffered" versions, that is with memory, of one of the signals and the relative complementary signal (out of phase by 180°); an electric signal 39 that represents an NRZ type signal before the passage of the block 13; an electric signal 40 that represents an electric phase signal made by the block 9, representing an auxiliary clock function; an electric signal 17 at the output from said block 9; an electric signal 10 that represents a clock signal translated by 180°; an electric signal 43 that represents a master clock signal at the input of the codifying system (not present in the Figure); an electric signal 44 that represents the string of NRZ type bits at the input of the codifying system and an electric signal 45 that represents the data in CMI form generated by the codifying system.

The electric signal 45, therefore, represents the output of the codifying system and is a CMI type signal that is the code of the electric signal 17.

In fact, if an interval $\alpha$ is considered and if said two electric signals 17 and 45 are observed, it can be noted that, when the electric signal 17 has a "0" bit, the circuit system codifies said bit so that for half period there is a negative value and for the rest of the period there is a positive value, while, if the electric signal 17 presents a "1" bit, the circuit system codifies said bit at a positive or negative value for the entire duration of the bit in function of the polarity used for the transmission of the last "1" bit.

In the specific case of this electric simulation it can be observed, in addition, that during a period $\beta$ of the signal 17 a CMI code is generated, signal 45, having a low value because in the period previous to $\alpha$, called $\delta$, said signal 45 in function of the "1" bit of the signal 17 had a high value.

It can be deduced, therefore, that the rules for correct CMI type codification are always complied with and in addition that the limits set by the time masks set by the G703 ITU are always verified.

What is claimed is:

1. A circuit system suitable for codifying NRZ type binary signals into CMI type binary signals comprising:
   a presynchronization device which receives in input said NRZ type binary signals and an out-of-phase clock signal;
   a first bistable means which receives a synchronous clock signal and the output of said presynchronization device;
   a combinatory logic device which receives said NRZ type binary signals and the output of said first bistable means;
   a second bistable means which receives said synchronous clock signal and the output of said combinatory logic device;
   a third bistable means which receives said synchronous clock signal and the output of said presynchronization device; and
   an EXOR type logical gate which receives the outputs of said second and third bistable means and generates an output which is the input of said combinatory logic device, so as to determine an identical physical path for the codifying of the "1" bit and of the "0" bit, whether the transition is on the leading edges and/or trailing edges or at mid period (T), bits present in said NRZ type binary signals, so that the parameters set by the G703 ITU standard for the creation of said CMI type binary signals are complied with.

2. The circuit system according to claim 1, wherein said bistable means are flip-flop toggler type memory devices.

3. The circuit system according to claim 2, wherein one of the said flip-flop togglers, called "info", stores which is the sign of the last "1" bit sent present in said NRZ type binary signals.

4. The circuit system according to claim 2, wherein another one of said flip-flop togglers, called "boundary", memorizes for every single bit present in said NRZ type binary signals, once elaborated by said combinatory logic device, which type of transitions said bit undergoes on the leading and trailing edges.

5. The circuit system according to claim 2, wherein in that another of said flip-flop togglers, called "middle", memorizes for every single bit present in said NRZ type binary signals, once elaborated by said combinatory logic device, which type of transition comes about halfway through the duration of the period (T) of the bit under examination.

6. The circuit system according to claim 1, wherein said combinatory logic device creates a combinatory process between said NRZ type binary signals and the value of the output of said EXOR type logical gate so as to establish if the transition is on the edges or at mid period (T) of the bit under examination.

7. The circuit system according to claim 1, wherein the circuit system is a synchronous circuit system further comprising a master clock signal.

8. The circuit system according to claim 2, wherein the circuit system is a synchronous circuit system further comprising a master clock signal.

9. The circuit system according to claim 3, wherein the circuit system is a synchronous circuit system further comprising a master clock signal.

10. The circuit system according to claim 4, wherein the circuit system is a synchronous circuit system further comprising a master clock signal.

11. The circuit system according to claim 5, wherein the circuit system is a synchronous circuit system further comprising a master clock signal.

12. The circuit system according to claim 6, wherein the circuit system is a synchronous circuit system further comprising a master clock signal.

* * * * *